(12) United States Patent
Welch et al.

(10) Patent No.: US 6,617,850 B2
(45) Date of Patent: Sep. 9, 2003

(54) MOTION CORRECTION OF MAGNETIC RESONANCE IMAGES USING PHASE DIFFERENCE OF TWO ORTHOGONAL ACQUISITIONS

(75) Inventors: Edward Brian Welch, Rochester, MN (US); Armando Manduca, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 10/008,151

(22) Filed: Dec. 3, 2001

(65) Prior Publication Data

US 2003/0102864 A1 Jun. 5, 2003

(51) Int. Cl.$^7$ .................................................. G01V 3/00
(52) U.S. Cl. ........................................ 324/309; 324/307
(58) Field of Search ................................ 324/309, 307, 324/311, 306, 318; 600/410, 415, 419

(56) References Cited

U.S. PATENT DOCUMENTS

| | | | |
|---|---|---|---|
| 5,363,044 A | 11/1994 | Xiang et al. | 324/307 |
| 5,729,140 A | 3/1998 | Kruger et al. | 324/309 |
| 5,933,006 A | 8/1999 | Rasche et al. | 324/307 |
| 6,114,852 A | * 9/2000 | Zhou et al. | 324/306 |
| 6,385,478 B1 | * 5/2002 | Hajnal | 600/410 |
| 6,518,759 B2 | * 2/2003 | Bernstein | 324/307 |

OTHER PUBLICATIONS

MR Image Artifact From Periodic Motion, Medical Physics, vol. 12, No. 2, Mar/Apr/ 1985, 142–151, Michael L. Wood, et al.

An Orthogonal Correlation Algorithm for Ghost Reduction in MRI, MRM 98:678–686 (1997), Kruger, et al.

Two–Point Interference Method for Suppression of Ghost Artifacts Due to Motion, JMRI, Nov/Dec 1993, 900–906, Qing–San Xiang, et al.

* cited by examiner

*Primary Examiner*—Edward Lefkowitz
*Assistant Examiner*—Brij B. Shrivastav
(74) *Attorney, Agent, or Firm*—Quarles & Brady, LLP

(57) ABSTRACT

Two magnetic resonance frequency domain data sets are acquired with the phase and frequency encoding gradient axes swapped. A k-space phase difference data set is computed from the two acquisitions and corrections for interview in-plane, rigid body translational motion are calculated from the phase difference information and a large set of simultaneous linear equations. The two acquired data sets are corrected with phase changes to compensate for the subject motion and then combined to form a single image.

13 Claims, 4 Drawing Sheets

MOTION CORRECTION OF MAGNETIC RESONANCE IMAGES USING PHASE DIFFERENCE OF TWO ORTHOGONAL ACQUISITIONS

STATEMENT REGARDING FEDERALLY SPONSORED RESEARCH

This invention was made with government support under Grant No. CA86716 awarded by the National Institute of Health. The United States Government has certain rights in this invention.

BACKGROUND OF THE INVENTION

The field of the invention is nuclear magnetic resonance imaging (MRI) methods and systems. More particularly, the invention relates to the reduction of image artifacts caused by subject motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Subject motion remains a limiting factor in many MRI applications despite many suggested approaches to reduce or compensate for its effects. These include: altered phase encode (PE) ordering as described in U.S. Pat. Nos. 4,706,026 and 4,663,591; gradient moment nulling as described in U.S. Pat. No. 4,731,583; navigator echoes as described in U.S. Pat. No. 4,937,526; navigatorless acquisition trajectories that use the acquired data itself to track motion as described in U.S. Pat. Nos. 5,323,110 and 5,382,902; post processing techniques based on the raw data alone as described in Manduca, et al "Autocorrection in MR Imaging: Adaptive Motion Correction Without Navigator Echoes", *Radiology* 2000; 215:904–909 and other phase correction strategies as described in Wood et al "Planar-Motion Correction Using K-space Data Acquired by Fourier MR Imaging", *J. Magn. Reson. Imaging* 1995; 5:57–64. It is well known that in-plane 2-D rigid body translations of an object during an MRI acquisition will create image artifacts along the phase encode direction in standard 2DFT imaging. Methods have been proposed to take advantage of the directionality of the artifacts to improve image quality by combining images with dissimilar artifact patterns. Two such methods are ghost interface techniques as described in Xiang et al "Two-Point Interface Method For Suppression Of Ghost Artifacts Due To Motion", *J. Magn. Reson. Imaging* 1993; 3:900–906 and the orthogonal correlation method as described in U.S. Pat. No. 5,729,140. Neither technique attempts to deduce the motion record or to correct the k-space phase errors.

SUMMARY OF THE INVENTION

The present invention is a method and apparatus for producing an MR image corrected for rigid body, in-plane, translational subject motion in which two separate acquisitions of k-space data are acquired for the same subject with the direction of the imaging gradients swapped. The phase differences between the two acquired k-space data sets at overlapping positions in k-space are then used to calculate corrections for each acquisition using a set of equations that describe phase changes caused by subject motion.

A general object of the invention is to correct for rigid body, in-plane, translational subject motion. By acquiring two data sets of the subject with the imaging gradient direction switched, sufficient information is contained in the k-space phase difference data to solve linear equations that describe phase corruption due to rigid body, in-plane translational motion. Corrective data is produced by solving these equations.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

Figure 1:
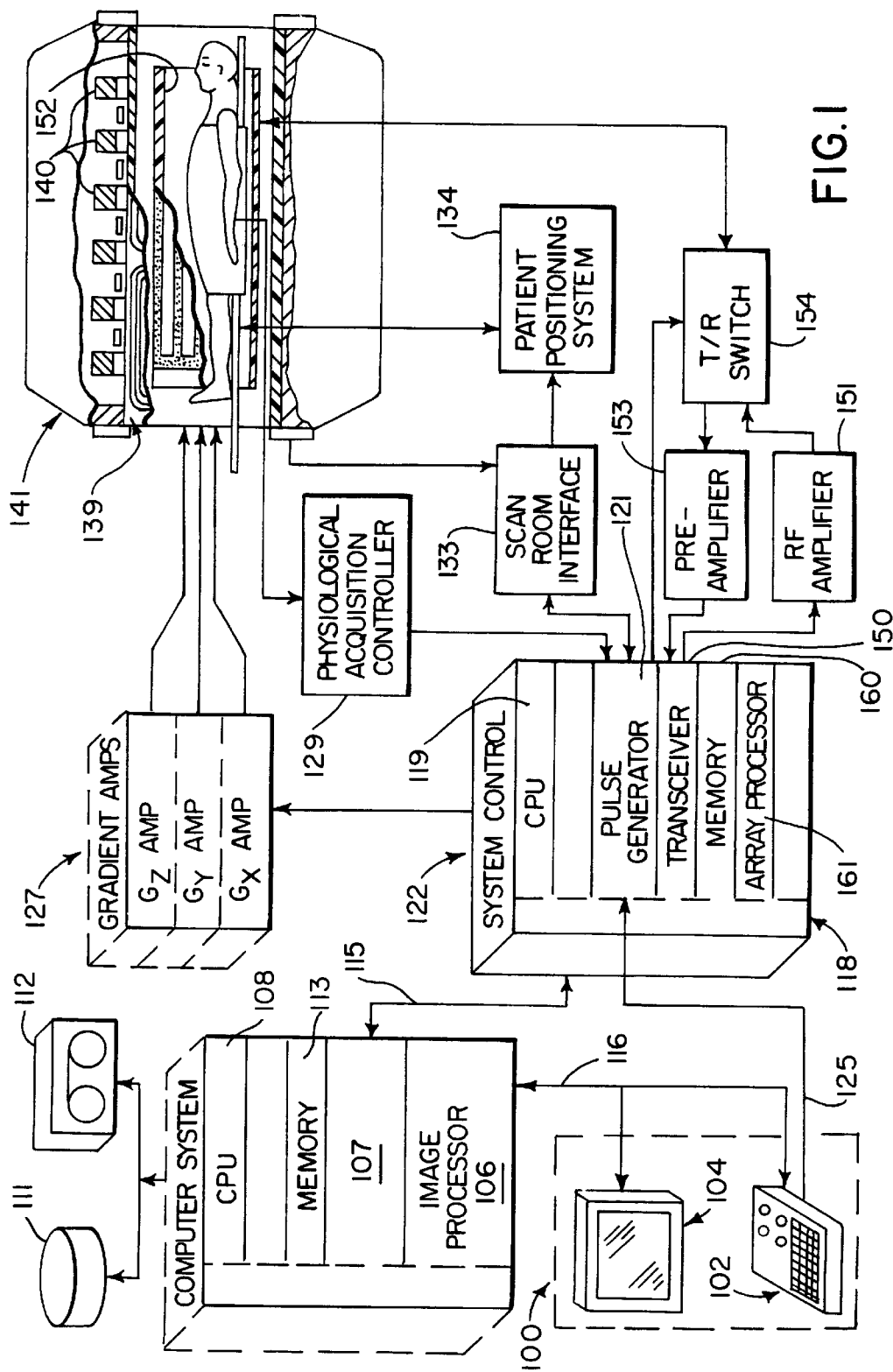
FIG. 1 is a block diagram of an MRI system which employs the present invention.

Translational motion of the subject corrupts the phase of the measured MRI signal. A general equation for phase corruption of an NMR signal due to in-plane, rigid body translation is $$S'(k_x, k_y) = e^{i\phi(k_x, k_y)} S(k_x, k_y) \quad \text{Eq. (1)}$$

where $$\phi(k_x, k_y) = 2\pi[k_x \Delta x + k_y \Delta y] \quad \text{Eq. (2)}$$

Here $S(k_x, k_y)$ is the original uncorrupted signal, $\phi(k_x, k_y)$ is the phase corruption, $S'(k_x, k_y)$ is the measured corrupted signal, $k_x$ and $k_y$ are the spatial-frequency coordinates of the signal sample, and $\Delta x$ and $\Delta y$ are the relative displacement of the imaged object at the moment $S'(k_x, k_y)$ was sampled. Often in clinical MRI applications using a 2DFT acquisition, the sampling of one view or row of k-space is fast enough to assume that no motion occurs during the readout of the MR signal. Thus, if one knows the relative interview motion of the imaged object, it is possible to apply phase corrections to the acquired NMR signal to correct the corruption due to this type of motion.

If one assumes two full NEX 2-D acquisitions with in-plane translational interview motion, 4N unknown motions may corrupt the two N pixel×N pixel images. The phase difference at each point in k-space yields a system of $N^2$ equations involving only 4N unknowns. For example, two 256×256 acquisitions with swapped phase encoding gradient direction yield 65,536 equations with only 1,024 unknowns. If the two acquisitions have the same phase encoding direction, the rank of the system is only 2N, and it is not possible to solve for the individual motions. However, if the acquisitions have swapped (and thus orthogonal) phase encoding directions, sufficient independent information is available to make correction possible. The resulting system of phase difference equations for the orthogonal case has a rank equal to 4N−4, meaning that it is possible to solve for the unknown motions to within four degrees of freedom. Two of these degrees of freedom correspond to change in the reference (x,y) position of the imaged object, and the third is an arbitrary constant phase shift in one acquisition relative to the other. These have no effect on image quality. The fourth degree of freedom corresponds to arbitrary linear trends in the readout gradient direction motion records that cancel each other upon subtraction. The linear trends in the readout gradient records can, however, affect the quality of the images and should be accounted for after solving for the motions.

Using equations (1) and (2) it is possible to build a large system of matrix equations describing the phase corruption, $\Delta \phi$, at the ($n_1$, $n_2$) location in k-space for an image with a first phase encoding direction in the $n_1$ direction (Eq. (3)) and for an image with a second phase encoding direction in the $n_2$ direction (Eq. (4)). The phase difference between the two corrupted acquisitions (Eq. (5)) contains the information necessary to find corrections for the images individually.

$$\Delta \Phi_A[n_1, n_2] = \frac{2\pi}{FOV}(k[n_1]P_A[n_1] + k[n_2]F_A[n_1]) \quad \text{Eq. 3}$$

$$\Delta \Phi_B[n_1, n_2] = \frac{2\pi}{FOV}(k[n_2]P_B[n_2] + k[n_1]F_B[n_2]) \quad \text{Eq. 4}$$

$$\Delta \Phi_{A-B}[n_1, n_2] = \Delta \Phi_A[n_1, n_2] - \Delta \Phi_B[n_1, n_2] \quad \text{Eq. 5}$$

FOV is the size of the square field-of-view in distance [e.g. cm or mm], and the length N vector k holds the frequency space coordinates (−[N−1]/2 to +[N−1]/2) across one row or column of k-space and is related to the spatial frequency ($k_x$, $k_y$) position by $$k_x = \frac{k[n_1]}{FOV} \text{ and } k_y = \frac{k[n_2]}{FOV}. \quad \text{Eq. 6}$$

The length N vectors $P_A$ and $F_A$ are the motion records in distance [e.g. cm or mm] for the first image in the phase encoding and readout gradient directions respectively. Similarly, $P_B$ and $F_B$ are motion records for the second image. After the phase difference in Eq. (5) is unwrapped, the motions are found by a weighted least squares inversion of the large system of equations.

The fundamental assumption of the method is that phase differences between the two acquisition at corresponding points in k-space are due only to translational motion. Clearly, many other factors, such as rotational motions, through-plane motions, non-rigid deformations, k-space sampling misalignment, and noise can also cause such phase differences. However, the highly overdetermined nature of the system of equations to some extent allows correction of data corrupted by these other confounding factors.

This technique is based on harnessing the combined information from two 2DFT scans of the same moving object with phase encode direction along two orthogonal axes. It has not been realized before that such combined scans have sufficient linearly independent information to fully determine arbitrary interview in-plane, rigid body translational motions occurring during each scan. This technique directly accounts for such motion and experimental results using repeated 2DFT spin-echo scans demonstrate dramatic improvement even in the presence of noise and other possible real world confounding factors.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

The present invention may be straightforwardly implemented using the MRI system of FIG. 1 and nearly any Cartesian-sampled 2DFT imaging pulse sequence, although extension to other non-Cartesian trajectories is possible. The first preferred embodiment for the technique is the case of a conventional 2DFT spin echo pulse sequence in which the prescribed image is acquired with the phase encoding axis oriented in a selected direction and the readout axis oriented in a selected orthogonal axis. The same prescribed image is then acquired, but with the two imaging gradients swapped. That is, the readout gradient axis is directed in the original selected direction (that used for phase encoding in the first acquisition) and the phase encoding gradient axis is oriented in the other, orthogonal, direction (that used for the readout, frequency encode, direction in the first acquisition). These prescriptions are available on any conventional MR scanner. As will be explained in detail below, the two k-space data sets acquired with these acquisitions are then processed to produce a single prescribed image in which artifacts caused by patient motion are suppressed.

Figure 2:
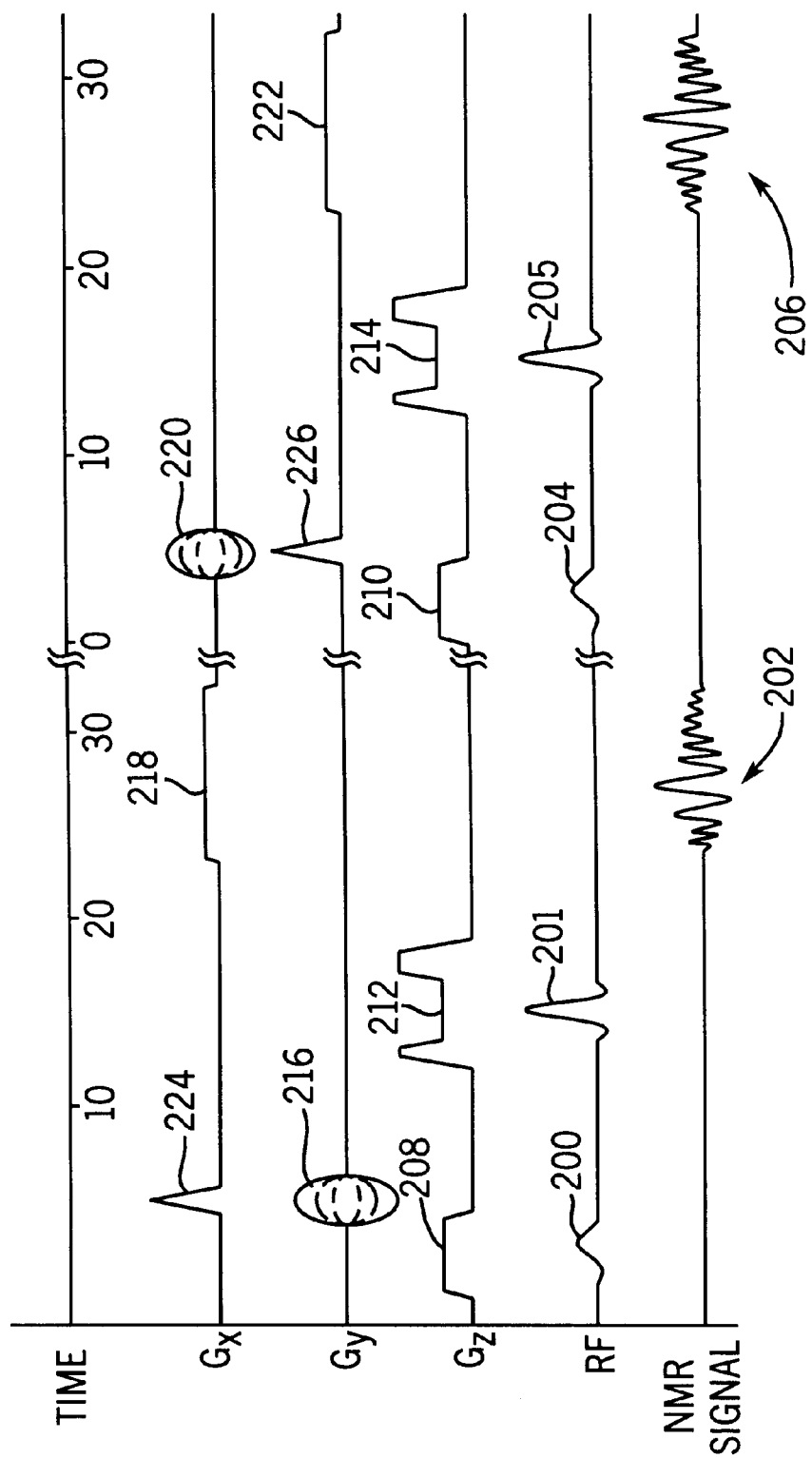
FIG. 2 is a graphic representation of a preferred pulse sequence used by the MRI system in FIG. 1 to practice the present invention.

In the second preferred embodiment a pulse sequence which acquires both k-space data sets in a single interleaved scan is used. Referring particularly to FIG. 2, this pulse sequence includes a first section in which a first rf excitation pulse 200 followed by an rf inversion pulse 201 is produced and a first NMR echo signal 202 is acquired; and a second section in which a second rf excitation pulse 204 followed by a second rf inversion pulse 205 is produced and a second NMR echo signal 206 is acquired. A slice select gradient is the same during both sections of the pulse sequence and includes respective slice select gradient pulses 208 and 210 applied during rf excitation, and respective slice select gradient pulses 212 and 214 applied during rf inversion. As is well known in the art, the magnitude of these slice select gradients operate in combination with the applied rf waveforms to affect spin magnetization in the prescribed slice location and thickness.

The remaining two imaging gradients, phase encoding and readout, are swapped during the performance of this preferred pulse sequence. During the first section a phase encoding gradient pulse 216 is produced along the $G_y$ gradient axis immediately after rf excitation pulse 200, and a readout gradient pulse 218 is produced along the $G_x$ gradient axis during acquisition of the first NMR echo signal 202. During the second section a phase encoding gradient pulse 220 is produced along the $G_x$ gradient axis and a readout gradient pulse 222 is produced along the $G_y$ gradient axis. The first section also includes a prephaser gradient pulse 224 along the $G_x$ readout axis, and a similar prephaser gradient pulse 226 is produced along the $G_y$ readout axis during the second section.

The two sections are essentially the same except the imaging gradient waveforms for phase encoding and readout are swapped, or switched from one section to the next. The pulse sequence is repeated and the phase encoding stepped through values to sample the prescribed k-space at the prescribed resolution. The acquired NMR echo signals 202 are stored as one k-space data set and the acquired NMR echo signals 206 are stored as a second k-space data set. This "interleaved" acquisition of views for both data sets is favorable because the motion corrupting the two data sets is highly correlated allowing for the possibility to solve for fewer unknown translations.

Figure 3:
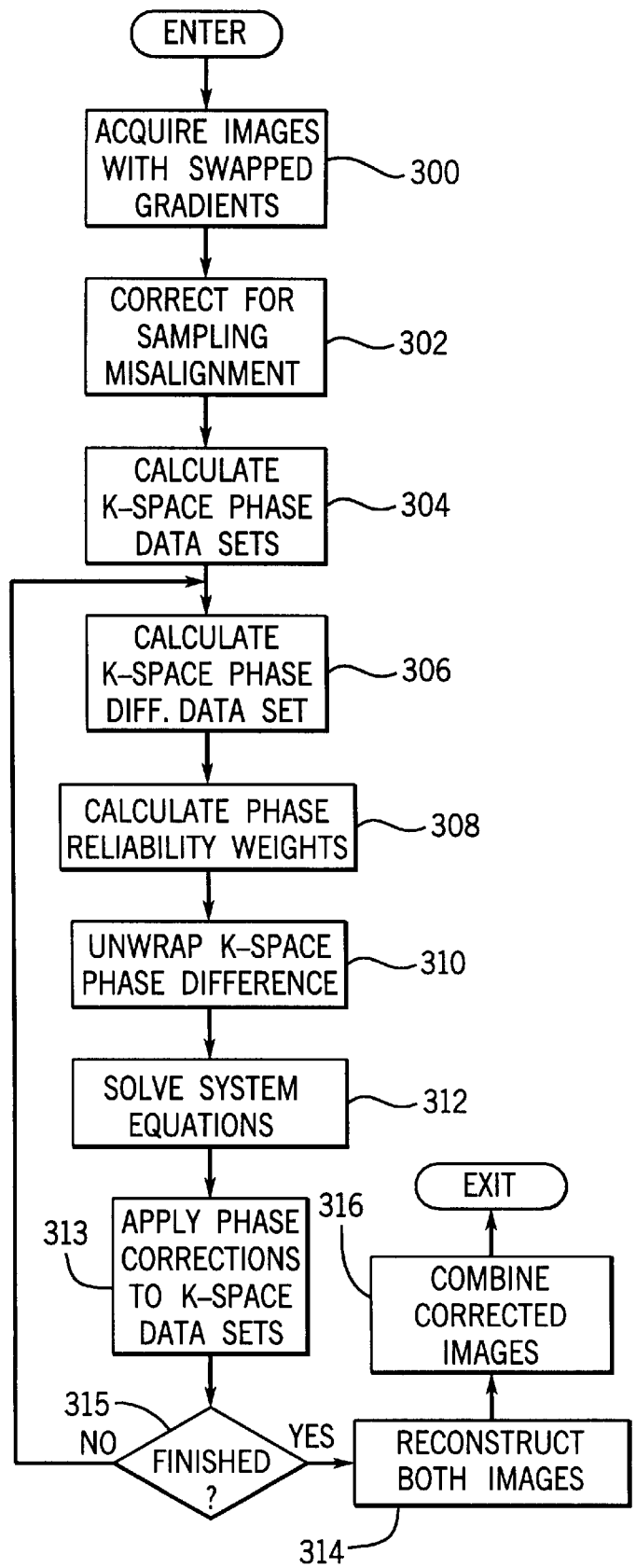
FIG. 3 is a flow chart of the steps in the preferred method for practicing the present invention.

Referring particularly to FIG. 3, the first step in the method, as indicated at process block 300, is to acquire two k-space data sets of the subject with the two imaging gradient fields swapped. As indicated above, in the preferred embodiment the pulse sequence of FIG. 2 is employed and two two-dimensional k-space data sets are acquired in which k-space is sampled along substantially orthogonal trajectories. The k-space sampling in the two acquired orthogonal data sets may not occur at exactly the same locations throughout k-space due to non-ideal gradient hardware, as described by Hamilton, et al, "Crisscross MR Imaging: Improved Resolution By Averaging Signals With Swapped Phase-Encode Axes", *Radiology* 1994; 193:276–279. A first-order correction is made at process block 302 to correct for a single ($\Delta k_x$, $\Delta k_y$) misalignment by compensating any observed phase roll in the spatial domain phase difference image in block 302. Each k-space sample is a complex number having two values, I and Q, and the k-space phase ($\phi=\tan^{-1}(I/Q)$) at each sample is calculated next at process block 304 to form two k-space phase data sets. The phase difference at corresponding samples in each of the two k-space phase data sets is calculated at process block 306 to form a single, two-dimensional k-space phase difference data set.

As indicated at process block 308, the next step is to calculate a weighting matrix which indicates the reliability of the acquired phase difference data. As is known in the art, the reliability of phase information sampled at the periphery of k-space is much less than the reliability of samples near the center of k-space. The weighting matrix may be calculated using phase variance or with a noise estimate obtainable from the k-space magnitude difference. As a result, k-space samples with a higher magnitude are given a higher weight in the weighting matrix and their phase difference information is deemed more reliable.

Next, the phase difference values in the k-space phase difference data set are unwrapped as indicated at process block 310. As is well known in the art, phase unwrapping is done to properly indicate phase differences greater than 360°. The currently preferred method is that known as the Preconditioned Conjugate Gradient (PCG) method disclosed by Ghiglia, et al, "Two-Dimensional Phase Unwrapping: Theory, Algorithms, and Software," New York: John Wiley & Sons; 1998, 493p., but other methods may perform equally well or better.

The unwrapped k-space phase difference data set and the weighting matrix are used to solve the above system of equations (4), (5) and (6) as indicated by process block 312. In the currently existing embodiment, the conjugate gradient squared method (CGS) which is available in the program sold under the trademark MATLAB® by MathWorks, Inc. of Natick Mass. is used to perform the weighted least squares inversion of the system of equations in a fast iterative manner. To increase numerical stability of the matrix inversion, the system of equations is regularized, or conditioned, by setting the frequency space coefficients of the phase encode motion in equations (4) and (5) equal to a constant before solving. The resulting output of the matrix inversion for the phase encode direction motions corruptions is then converted to phase corruption in radians. No similar numerical instability exists for determining the frequency encode direction motion records, and these are calculated in units of distance (e.g. cm or mm) before being converted to phase change in units of radians. Finally, the phase corruption due to motion is corrected by applying compensating phase corrections to the corresponding k-space samples in the two k-space data sets in block 313.

As indicated at decision block 315, if the phase corrections are large, the system loops back to process block 306 to reiterate the correction steps. This continues until the phase corrections drop below a preset value. Once the k-space phase difference is satisfactorily corrected, the k-space data is used to reconstruct two images as indicated at process block 314. Typically, this is done by performing a two-dimensional Fourier transformation. While the two corrected images may be displayed separately, in the preferred embodiment the two images are combined as indicated at process block 316 to produce one image with a higher signal-to-noise ratio (SNR) and with further suppressed motion artifacts. This may be done by either geometrically or algebraically averaging the magnitude of each corresponding pixel in the two images. Geometric averaging in which the square root of the two multiplied pixel magnitudes is calculated is preferred because it also helps suppress ghost artifacts.

Figure 4A:
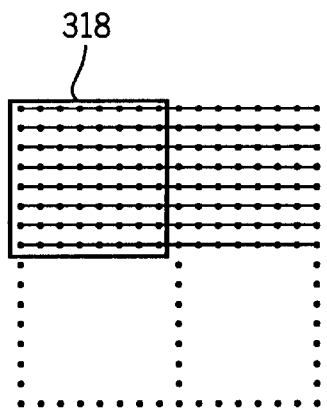
FIGS. 4a and 4b are graphic representations of an alternative method for acquiring two images with orthogonal phase encoding gradients.
Figure 4B:
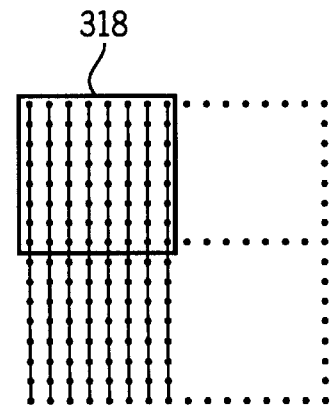

The technique may also be applied to fractional NEX 2DFT acquisitions, such as 0.5 NEX and 1.5 NEX acquisitions. For the 0.5 NEX case one collects two separate orthogonal acquisitions each with N/2 views as shown for example in FIGS. 4a and 4b. One 0.5 NEX acquisition is performed with phase encoding along one axis and the second 0.5 NEX acquisition is performed with phase encoding switched to an orthogonal axis. The two datasets overlap in one quadrant of k-space indicated by square 318, and that overlapping portion provides $N^2/4$ phase difference equations to solve for 2N unknowns. After the corrections are found and applied, the individual half NEX acquisitions are reconstructed by the standard homodyne technique or the phase information in the orthogonal views may aid the homodyne reconstruction procedure in the estimation of the conjugate side of k-space.

Figure 5A:
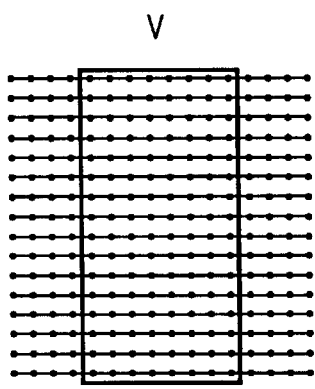
FIGS. 5a and 5b are graphic representations of a second alternative method for acquiring two images with orthogonal phase encoding gradients.
Figure 5B:
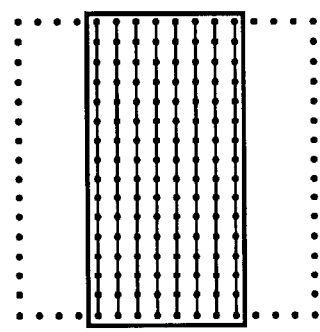

Another 2-D strategy is the 1.5 NEX acquisition strategy shown in FIGS. 5a and 5b, which requires less time to acquire than two orthogonal full NEX acquisitions. A 1.0 NEX acquisition is performed with phase encoding along one axis and a 0.5 NEX acquisition is performed with phase encoding switched to the orthogonal axis. The two k-space data sets overlap in the central region indicated by block 320. In this case, $N^2/2$ phase difference equations are available to solve for 3N unknowns. The orthogonal views are positioned in the central portion of k-space, because the phase difference data set there has higher SNR. The number of lines in the second acquisition could be reduced to less than 0.5 NEX, and the second acquisition could be thought of not as collecting image information but rather only the information needed to correct the original full acquisition for motion effects. In theory, this could be done with as few as 3 orthogonal views, but in practice the SNR considerations appear to mandate a much larger number.

Therefore, the two acquisitions need not cover all of k-space as long as the overlapping portions are sufficiently large to contain enough linearly independent information to allow for correction. Clearly, many such variations of these strategies are possible with the basic principle always being that phase differences between corresponding points in two orthogonally acquired k-space data sets contain sufficient information to deduce translational motion affecting each of the acquisitions. Furthermore, the data acquisitions need not be sampled on a regular Cartesian grid as in 2DFT spatial encoding. In general, the second or complimentary data acquisition containing enough information for correction of the first, should acquire samples in a single TR (repetition time) that lie on a trajectory overlapping or intersecting a sufficient number of the data sample views collected in the first acquisition. For example, a radial trajectory (used in projection reconstruction MR imaging) acquisition could be corrected by linearly independent circular trajectories that each intersect with all of the spokes of the radial sampling scheme. Similarly, orthogonal trajectories could be designed to compliment a spiral acquisition. Correction of Cartesian-sampled 2DFT acquisitions is just one of the potential embodiments of the fundamental idea of correcting two data sets with enough linearly independent information to correct for data corruption due to motion.

The invention can also be extended to 3-D imaging. If data is acquired in a three-dimensional volume with orthogonal readout directions, the method is equally applicable. Equations (8)–(10) express the relationship between the translation in all three directions and the added phase corruption.

$$\Delta\Phi_A[n_1, n_2, n_3] = \frac{2\pi}{FOV}(k[n_1]P_A[n_1+Nn_3] + k[n_2]F_A[n_1+Nn_3] + k[n_3]Q_A[n_1+Nn_3]) \quad \text{Eq. (8)}$$

-continued $$\Delta\Phi_B[n_1, n_2, n_3] = \qquad \text{Eq. (9)}$$
$$\frac{2\pi}{FOV}(k[n_2]P_B[n_2 + Nn_3] + k[n_1]F_B[n_2 + Nn_3] + k[n_3]Q_B[n_2 + Nn_3])$$

$$\Delta\Phi_c[n_1, n_2, n_3] = \qquad \text{Eq. (10)}$$
$$\frac{2\pi}{FOV}(k[n_1]P_c[n_1 + Nn_2] + k[n_3]F_c[n_1 + Nn_2] + k[n_2]Q_c[n_1 + Nn_2])$$

There are three motion records with two being phase encode motion records (P and Q). To obtain a system of equations with enough equations to solve for all unknowns, it is necessary to acquire all three 3-D orientations. This yields a system with $2N^3$ equations having a rank of $6N^2-8$. Though there may be up to $9N^2$ unknown translations that corrupt the three acquired N×N×N data volumes, two of the motions corrupting each view are phase encode motions that each cause a constant phase shift for that view. The sum of two constants is still a constant, and hence correcting for the two unknown phase encode motions reduces to correcting for a single unknown constant. The total number of relevant unknowns is thus $6N^2$, which can be solved for within 8 degrees of freedom. The acquisition time of three such cubic volumes may currently be prohibitively long, but faster imaging techniques in the future may allow for this application. Also, if it is possible to acquire an entire plane of k-space data in a time short compared to the time frame of subject motion, it is possible to simply acquire orthogonal k-space planes, all with the same frequency encode direction, and still build of system of linearly independent equations with high enough rank to perform phase corrections.

It will be recognized by those skilled in the art that many modifications may be made to the embodiments described above without departing from the broad inventive concepts of the invention. It should therefore be understood that this invention is not limited to the particular embodiments described herein, but is intended to include all changes and modifications that are within the scope and spirit of the invention set forth in the claims.

What is claimed is:

1. A method for correcting for in-plane, rigid body translational subject motion during data acquisition with a magnetic resonance imaging (MRI) system, the steps comprising:
   a) acquiring a first k-space data set with the MRI system from which an image of the subject may be reconstructed using a pulse sequence having a first imaging gradient direction arrangement in which a first imaging gradient is directed along a first axis and a second imaging gradient is directed along a second axis that is substantially orthogonal to the first axis;
   b) acquiring a second k-space data set with the MRI system from which an image of the subject may be reconstructed using a pulse sequence having a second imaging gradient direction arrangement in which the gradient directions are swapped such that the first imaging gradient is directed along the second axis and the second imaging gradient is directed along the first axis;
   c) calculating a k-space phase difference data set from phase information in the first and second k-space data sets;
   d) calculating corrections for subject motion using the k-space phase difference data set by solving a set of simultaneous linear equations that describe phase changes caused by subject motion; and
   e) applying the phase corrections produced in step d) to the first k-space data set.

2. The method as recited in claim 1 which includes:
   f) applying the phase corrections produced in step d) to the second k-space data set
   g) reconstructing two corrected images from the phase corrected k-space data sets; and
   h) combining the corrected images to form a single image of the subject.

3. The method as recited in claim 2 in which step h) is performed by averaging corresponding pixel magnitudes in the two corrected images.

4. The method as recited in claim 1 in which the pulse sequence used in steps a) and b) directs the MRI system to produce a readout imaging gradient and a phase encoding imaging gradient having respective orthogonal directions, and the second imaging gradient direction arrangement is produced by swapping the phase encoding and readout imaging gradient directions used in the first imaging gradient direction arrangement.

5. The method as recited in claim 1 in which the first and second k-space data sets sample throughout a same region in k-space.

6. The method as recited in claim 1 in which the first and second k-space data sets sample overlapping locations in k-space in a manner such that phase corruptions induced by subject motion in one k-space data set are substantially linearly independent from phase corruptions induced by subject motion in the second k-space data set.

7. The method as recited in claim 6 in which step c) includes:
   i) correcting for misalignment of the sample locations of said first and second k-space data sets.

8. The method as recited in claim 6 in which step c) includes:
   i) producing a k-space phase data set from each of said first and second k-space data sets by calculating the phase of the NMR signal sampled at each location in k-space; and
   ii) calculating the difference in phase at corresponding k-space locations in said first and second k-space phase data sets.

9. The method as recited in claim 8 in which step c) further includes:
   iii) unwrapping the phase difference values calculated in step ii) to indicate phase difference values greater than 360°.

10. The method as recited in claim 1 in which step d) includes:
   i) calculating a weighting matrix which indicates the reliability of the values in the k-space phase difference data set; and
   ii) weighting the k-space phase difference data set using the weighting matrix.

11. The method as recited in claim 1 in which the second k-space data set does not contain sufficient information to reconstruct an image.

12. The method as recited in claim 1 in which the first and second imaging gradient direction arrangements sample k-space trajectories that are substantially orthogonal with respect to each other.

13. The method as recited in claim 1 in which the first and second k-space data sets sample a three-dimensional k-space.

* * * * *

UNITED STATES PATENT AND TRADEMARK OFFICE
CERTIFICATE OF CORRECTION

PATENT NO.      : 6,617,850 B2
DATED           : September 9, 2003
INVENTOR(S)     : Welch et al.

It is certified that error appears in the above-identified patent and that said Letters Patent is hereby corrected as shown below:

<u>Title page,</u>
Item [*] Notice, should read -- [*] Notice: Subject to any disclaimer, the term of this patent is extended or adjusted under 35 U.S.C. 154(b) by 67 days. --

<u>Column 5,</u>
Line 16, "$G_2$" should be -- $G_z$ --.

Signed and Sealed this

Sixth Day of January, 2004

JAMES E. ROGAN
*Director of the United States Patent and Trademark Office*